United States Patent
Ueno

(10) Patent No.: US 11,206,747 B1
(45) Date of Patent: Dec. 21, 2021

(54) HEAT RELEASE DEVICE

(71) Applicant: Panasonic Intellectual Property Management Co., Ltd., Osaka (JP)

(72) Inventor: Taku Ueno, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/032,455

(22) Filed: Sep. 25, 2020

(51) Int. Cl.
*H05K 7/20* (2006.01)

(52) U.S. Cl.
CPC .................................. *H05K 7/2039* (2013.01)

(58) Field of Classification Search
CPC ............... H05K 1/0203; H05K 7/2039; H05K 7/20963; H05K 5/0217; H05K 2201/066; H05K 1/0204; H05K 7/20509; H05K 7/20436; H05K 7/20445
See application file for complete search history.

(56) References Cited

U.S. PATENT DOCUMENTS

| 6,351,387 | B1* | 2/2002 | Prasher | H01L 23/3735 |
| | | | | 174/252 |
| 2005/0112796 | A1* | 5/2005 | Ararao | H01L 21/4878 |
| | | | | 438/106 |
| 2006/0180926 | A1* | 8/2006 | Mullen | H01L 23/4093 |
| | | | | 257/727 |
| 2007/0041160 | A1* | 2/2007 | Kehret | H05K 7/20445 |
| | | | | 361/704 |
| 2007/0284730 | A1* | 12/2007 | Shi | H01L 21/50 |
| | | | | 257/704 |
| 2008/0036071 | A1* | 2/2008 | Li | H01L 24/72 |
| | | | | 257/700 |
| 2009/0154106 | A1* | 6/2009 | Lynch | H01L 23/3677 |
| | | | | 361/707 |
| 2013/0141866 | A1* | 6/2013 | Refai-Ahmed | H01L 23/3672 |
| | | | | 361/679.54 |
| 2014/0218870 | A1* | 8/2014 | Ho | H01L 23/4006 |
| | | | | 361/714 |
| 2016/0118315 | A1* | 4/2016 | Smith | H01L 23/427 |
| | | | | 257/713 |
| 2020/0107473 | A1* | 4/2020 | Tanabe | G06F 1/203 |
| 2021/0280495 | A1* | 9/2021 | Kumar | H01L 23/427 |

FOREIGN PATENT DOCUMENTS

| JP | 2009-94196 | 4/2009 |
| JP | 2011-9522 | 1/2011 |
| JP | 2012-151196 | 8/2012 |
| JP | 2012-160503 | 8/2012 |

* cited by examiner

*Primary Examiner* — Adam B Dravininkas
(74) *Attorney, Agent, or Firm* — Wenderoth, Lind & Ponack, L.L.P.

(57) ABSTRACT

A heat release device includes a housing, a substrate located within the housing, a heat source disposed on the substrate, a first member provided between the housing and the substrate and between the housing and the heat source, and a plurality of second members that support the first member from the substrate. The first member is disposed to have a gap with the heat source and so as to have a gap with the housing. Among the plurality of second members, a second member far from the heat source is larger in area in contact with the substrate and the first member than a second member close to the heat source.

4 Claims, 6 Drawing Sheets

HEAT RELEASE DEVICE

BACKGROUND OF THE INVENTION

1. Title of the Invention

The present disclosure relates to a heat release device.

2. Background of the Art

JP-A-2012-151196 discloses a heat shielding sheet used in electronic equipment including a substrate on which a heat generation component is mounted and a housing that houses the substrate. The heat shielding sheet includes an adhesive layer, a heat insulation sheet, a heat conduction sheet, and a protective layer. The heat shielding sheet adheres to the inside of the housing at a position facing the heat generation component through the adhesive layer. The heat shielding sheet and the heat generation component are confronted with each other with a space therebetween.

SUMMARY OF THE INVENTION

An object of the present disclosure is to provide a heat release device which can lower a temperature of a housing as a whole while preventing a front face of the housing from being locally hot.

The present disclosure provides a heat release device including a housing, a substrate located within the housing, a heat source disposed on the substrate, a first member provided between the housing and the substrate and between the housing and the heat source, and a plurality of second members that support the first member from the substrate, in which the first member is disposed so as to have a gap with the heat source and so as to have a gap with the housing, and among the plurality of second members, a second member far from the heat source is larger in area in contact with the substrate and the first member than a second member close to the heat source.

According to the present disclosure, it is possible to lower a temperature of the housing as a whole while preventing a front face of the housing from being locally hot.

DETAILED DESCRIPTION OF THE EXEMPLARY EMBODIMENT (Details of the Present Disclosure)

In a handset used in, for example, an aircraft, there is a rising demand for achieving both miniaturization as well as thinning and high performance. High performance increases heat generated from a processor such as a central processing unit (CPU) or a power supply circuit. On the other hand, miniaturization and thinning reduce heat release performance of the housing. As a result, when a temperature of a front face of the housing rises, a risk of incurring low temperature burns on a user holding the housing arises. Further, when heat is not sufficiently diffused in the housing, a point where the temperature rises locally occurs on the front face of the housing, and the risk of low temperature burns further rises.

Therefore, in the following embodiments, a heat release device which can lower the temperature of the housing as a whole while preventing the front face of the housing from being locally hot will be described.

Hereinafter, embodiments that specifically disclose configuration and action of the heat release device according to the present disclosure will be described in detail with reference to the accompanying drawings. However, unnecessary detailed description may be omitted. For example, detailed description of an already well-known matter or repeated description of substantially the same configuration may be omitted. This is to avoid unnecessary redundancy of the following description and to facilitate understanding of those skilled in the art. The accompanying drawings and the following description are provided for those skilled in the art to fully understand the present disclosure, and are not intended to limit the subject according to the claims.

Figure 1:
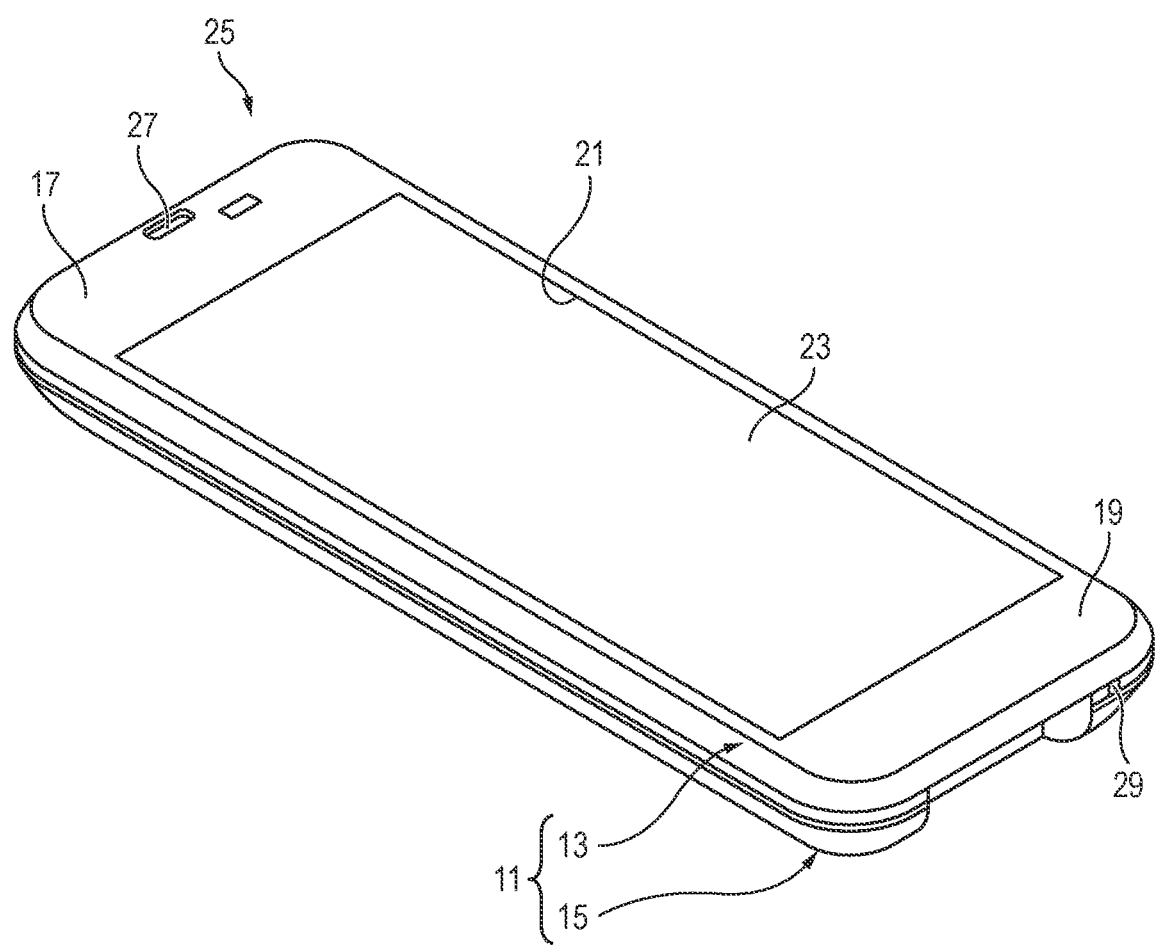
FIG. 1 is an appearance perspective view of a handset according to a first embodiment.

FIG. 1 is an appearance perspective view of a handset 25 according to a first embodiment. In the handset according to the first embodiment, an appearance of the housing 11 is formed in a rectangular plate shape. The housing 11 includes a bezel 13 and a rear case 15. The rear case 15 on a back face side is assembled to and integrated with the bezel 13 on a front face side in a thickness direction of the housing 11. A rectangular opening portion 21 that occupies most of area of the bezel 13 is formed between an upper frame 17 and a lower frame 19 on the bezel 13. A display 23 is exposed and held in the opening portion 21. In the first embodiment, the handset 25 equipped in an aircraft is described as an example of the heat release device according to the present disclosure. Button operation or the like of the handset 25 is performed by touching an icon displayed on the display 23. The heat release device according to the present disclosure is not limited to the handset 25 equipped in the aircraft as long as it is portable equipment whose miniaturization as well as thinning and high performance are required, and may be a portable terminal having a communication function or a call function, such as a consumer or business smartphone. A speaker 27 is provided on the upper frame 17 of the bezel 13. A microphone 29 is provided on the lower frame 19 of the bezel 13.

Figure 2:
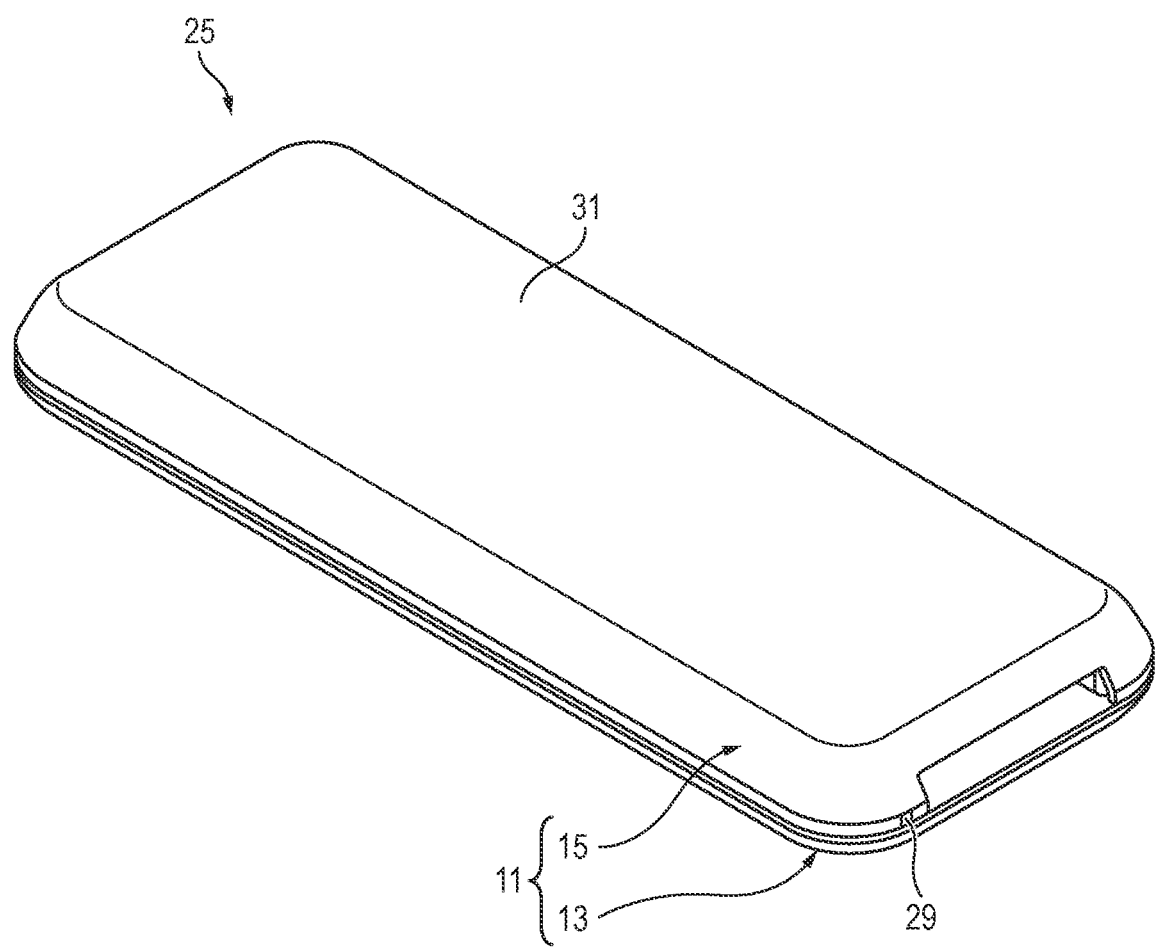
FIG. 2 is an appearance perspective view of a back face side of the handset shown in FIG. 1.

FIG. 2 is an appearance perspective view of a back face side of the handset 25 shown in FIG. 1. The rear case 15 is formed in a rectangular thin box shape. The rear case 15 is formed in a curved surface whose four side portions surrounding a back face 31 are chamfered. Four corner portions connecting four corners of the back face 31 and the bezel 13 are also formed in a chamfered curved surface. The back face 31 of the rear case 15 of the housing 11 is in contact with a palm of a user, and fingers of the user are hung on a side face of the rear case 15 or the bezel 13, so that the entire housing 11 is gripped by the user. The bezel 13 and the rear case 15 can be formed of, for example, resin or metal.

Figure 3:
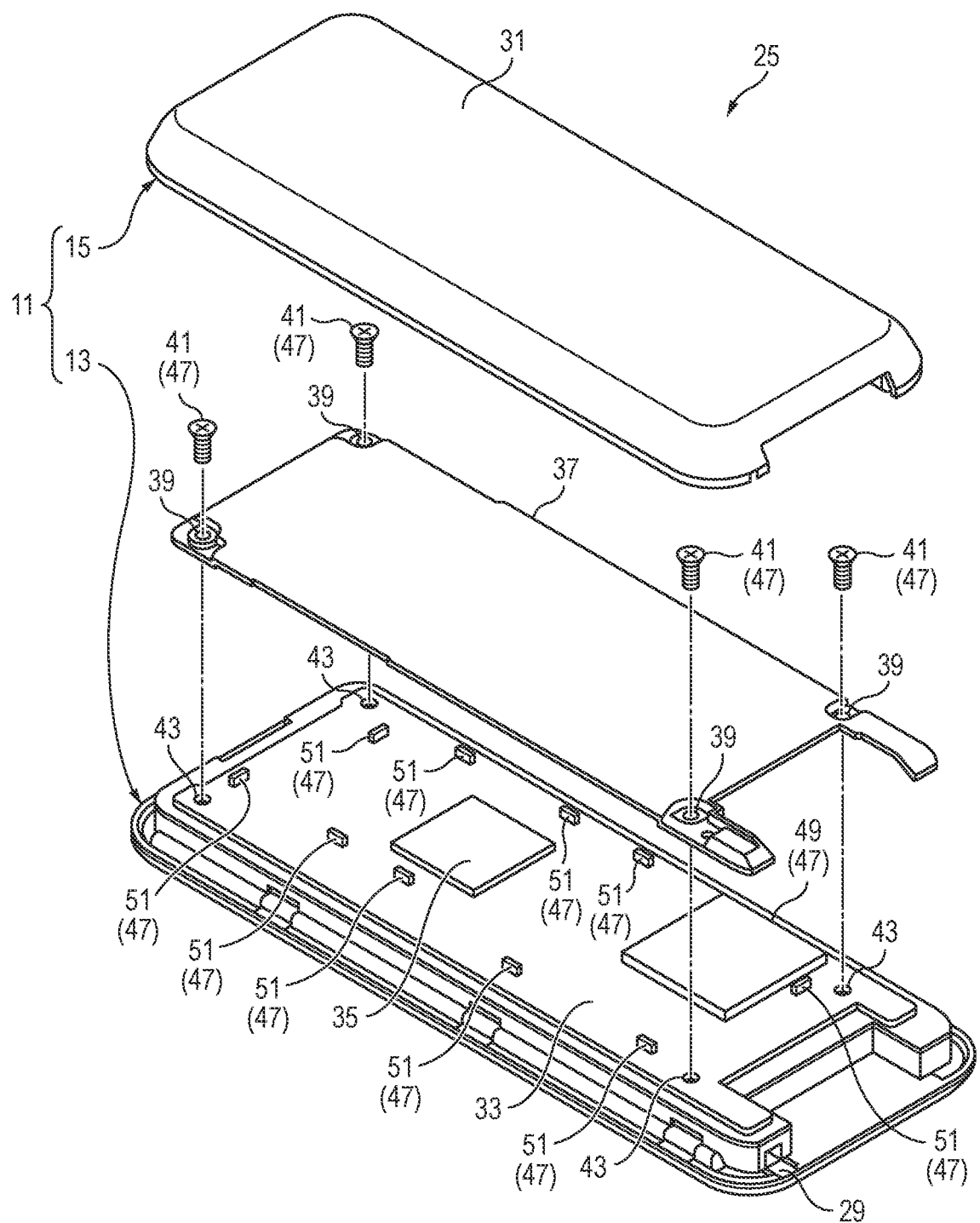
FIG. 3 is an exploded perspective view of the handset shown in FIG. 2.

FIG. 3 is an exploded perspective view of the handset 25 shown in FIG. 2. On a back face side of the bezel 13, a substrate 33 (PCB: Printed Circuit Board) on which electronic components are mounted is fixed on an opposite side of the bezel 13 with the display 23 sandwiched therebetween. The substrate 33 is formed in a rectangular shape having substantially the same size as the bezel 13 and is housed in the housing 11. The electronic component serving as a heat source is mounted on the substrate 33. In the first embodiment, the electronic component serving as a heat source is, for example, a CPU 35 to be surface mounted. In a surface mount device (SMD) to be surface mounted, about 90% of heat is conducted to the substrate 33. For example, the CPU 35 is biased toward the upper frame closer to the speaker 27 than the center of the substrate 33. The electronic component (for example, CPU 35) serving as a heat source may be mounted on either a face of the substrate 33 on the display 23 side or a face of the substrate 33 on the rear cover 31 side.

A first member 37 is provided between the rear case 15 and the substrate 33 and between the rear case 15 and the CPU 35. In the first embodiment, the first member 37 is made of a heat conductive resin. The first member 37 is formed in a plate shape substantially the same as that of the substrate 33. A screw insertion hole 39 is formed at each of four corners of the first member 37. The first member 37 is fixed to the substrate 33 by screwing a screw 41 inserted into the screw insertion hole 39 into a fixing hole 43 provided at each of four corners of the substrate 33. The first member 37 and the substrate 33 may be co-fastened and fixed to the bezel 13 by the screw 41. The first member 37 is fixed to the substrate 33 so as to have a gap 45 (see FIG. 5) with the CPU 35 and with the rear case 15.

The substrate 33 is provided with a plurality of second members 47 that support the first member 37 from the substrate 33. In the handset 25, with respect to areas of the plurality of second members 47 in contact with the substrate 33 and the first member 37, the area of the second member 47 far from the heat source is larger than the area of the second member 47 close to the heat source. In the handset 25, the second member 47 far from the heat source is a sheet 49 having heat conductivity, and the second member 47 close to the heat source is a spring 51 or a pin. The spring 51 or the pin includes a plate spring, a clip shaped pin, a cylindrical projection, a bent sheet metal, or the like.

The sheet 49 is biased toward the lower frame closer to the microphone 29 than the center of the substrate 33. That is, the sheet 49 is disposed on an opposite side of the CPU 35 across the center of the substrate 33. As the sheet 49, a heat conductive sheet having a high heat conductivity can be used. The sheet 49 is pasted to (in close contact with) the substrate 33 and the first member 37 by compressing a cushioning raw material. A height of the sheet 49 in a thickness direction is set large than a height of the CPU 35 from the substrate 33 (see FIG. 5). Thus, the first member 37 is supported by the substrate 33 leaving the gap 45 between the first member 37 and the CPU 35.

A plurality of springs 51 are dispersed on the substrate 33. In the first embodiment, for example, ten springs 51 or pins are provided. A base end of the spring 51 or the pin is fixed to the substrate 33, an upper end of the spring 51 or the pin is fixed to or abutted on the first member 37, so that the first member 37 can be supported by the substrate 33 without rattling.

In the present embodiment, a member having conductivity is used in the first member 37, the spring 51 is disposed around the CPU 35, and the spring 51 is connected to a ground of the substrate 33. Therefore, the first member 37 and the spring 51 function as a shield, and noise emission of the CPU 35 and the like can be reduced.

Figure 4:
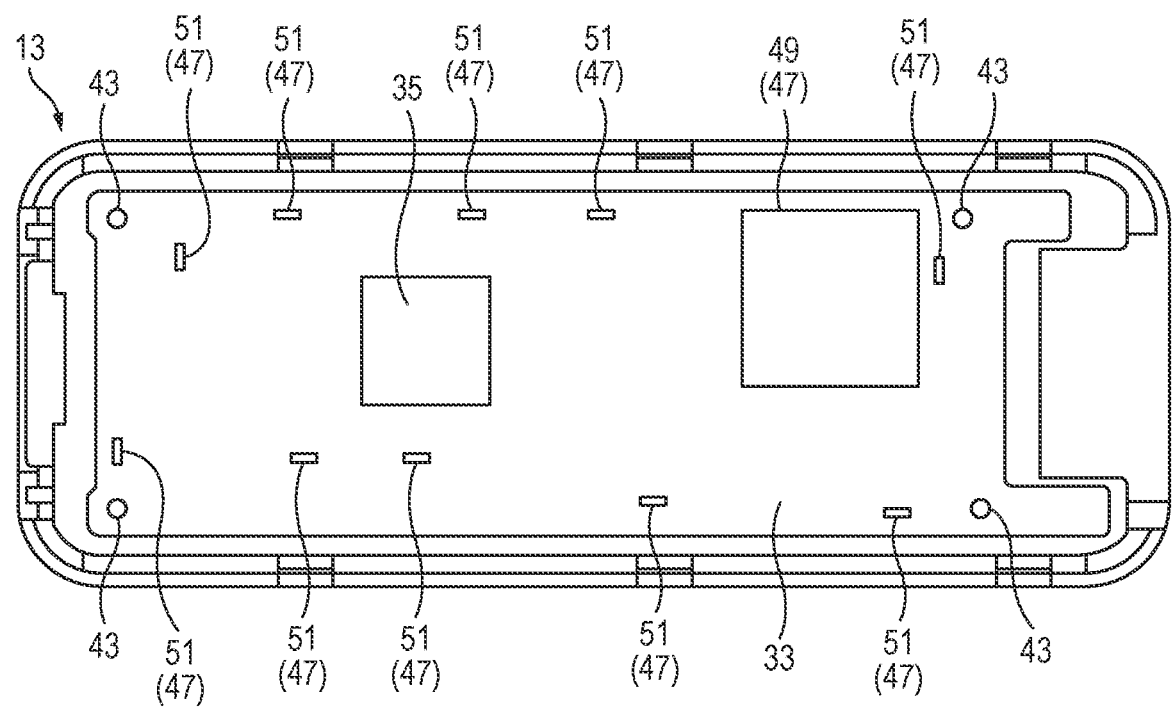
FIG. 4 is plan view of a substrate fixed to a bezel side shown in FIG. 3.

FIG. 4 is plan view of the substrate 33 fixed to a bezel side shown in FIG. 3. An individual area of the spring 51 or the pin is smaller than an area of the sheet 49. That is, with respect to areas of the plurality of second members 47 in contact with the substrate 33 and the first member 37, the area of the second member 47 far from the heat source (specifically, the sheet 49) is larger than the area of the second member 47 close to the heat source (specifically, the spring 51 or the pin) close to the heat source.

A third member 53 (see FIG. 5) having higher heat conductivity than that of the rear case 15 (a higher heat conductivity than that of the rear case 15) is provided on a face of the rear case 15 on the first member side. As the third member 53, for example, a graphite sheet can be used. Graphite is obtained by graphitization in which carbon is subjected to high temperature heat treatment. Graphite can be a crystalline body of carbon atoms having regular arrangement by burning impurities around the carbon atoms and has a high heat conductivity.

In a main region Ar of the substrate 33 (see FIG. 5), with respect to areas of the plurality of second members 47 in contact with the substrate 33 and the first member 37, the area of the second member 47 far from the heat source is formed larger than the area of the second member 47 close to the heat source. In the substrate 33, the second member 47 may be provided outside the main region Ar. Thus, the handset 25 does not exclude that the outside second member 47 (the spring 51 or the pin), whose area in contact with the substrate 33 and the first member 37 is smaller than that of the second member 47 far from the heat source (sheet 49), is disposed at a position farther from the heat source than the second member 47 far from the heat source (sheet 49).

Figure 5:
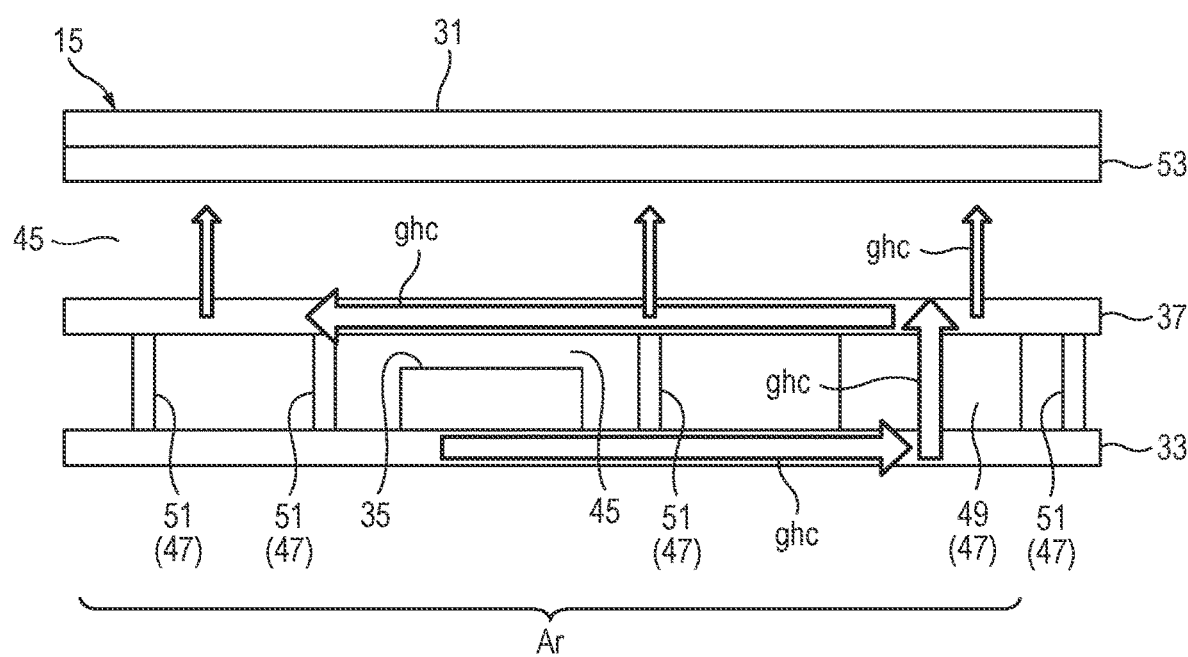
FIG. 5 is a schematic diagram showing the handset shown in FIG. 2 in a cross section in a thickness direction.

FIG. 5 is a schematic diagram showing the handset 25 shown in FIG. 2 in a cross section in a thickness direction. In the handset 25, most of heat qhc due to heat conduction is conducted from the CPU 35 as a heat source to the substrate 33. Most of the heat qhc diffused to the substrate 33 is conducted in the sheet 49 by heat conduction and flows to the first member 37. The heat qhc flowing to the first member 37 is diffused to the first member 37 by heat conduction. In addition, the heat qhc diffused to the substrate 33 flows to the first member 37 through the spring 51 or the pin by heat conduction, but as shown in FIG. 4, since the area of the sheet 49 is sufficiently larger than the area of the spring 51, the heat conducted from the spring 51 to the first member 37 is smaller than the heat conducted from the sheet 49 to the first member 37. That is, most of the heat qhc diffused to the substrate 33 is diffused to the first member 37 through the sheet 49.

In the first member 37, heat qht due to heat transfer is conducted slowly (that is, taking time) to the third member 53 through air present in the gap 45. In the heat transfer, three forms of heat conduction, heat convection, and heat radiation mix together to transfer heat.

Figure 6:
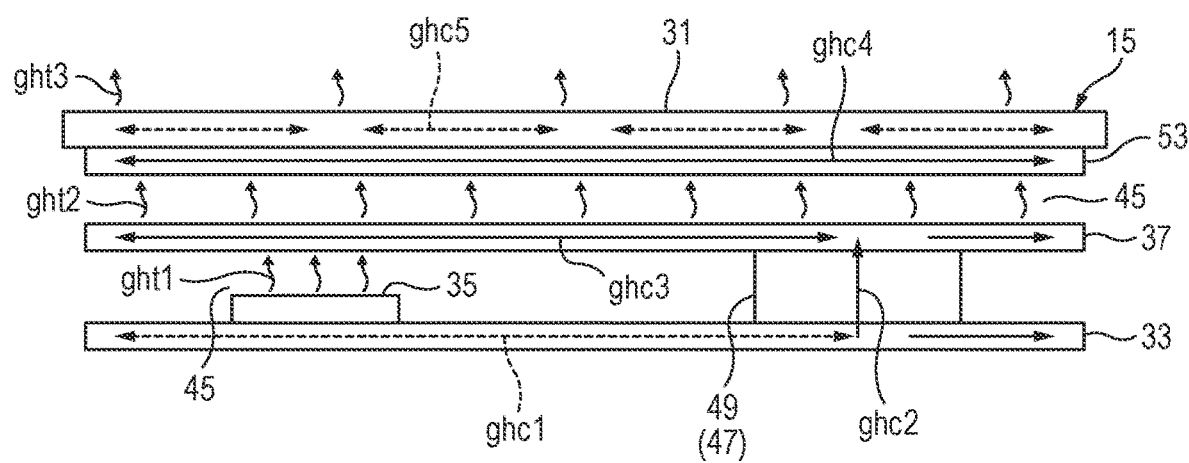
FIG. 6 is an action diagram schematically illustrating behavior of heat conducted from a heat source to the exterior of a housing.

FIG. 6 is an action diagram schematically illustrating behavior of heat conducted from a heat source to the exterior of the housing 11. More specifically, heat qhc1 due to heat conduction is diffused to the substrate 33. Most of the heat qhc1 is conducted in the sheet 49 as heat qhc2 due to heat conduction and flows to the first member 37. Heat qht1 is also conducted to the first member 37 by heat transfer from the CPU 35 as a heat source. Heat qhc3 conducted to the first member 37 is diffused to the first member 37 by heat conduction. The heat qhc3 diffused in the first member 37 becomes heat qht2 due to heat transfer and is conducted to the third member 53. Heat qhc4 conducted to the third member 53 is diffused in the third member 53 by heat conduction. The heat qhc4 is conducted to the rear case 15 by heat conduction and is diffused in the rear case 15 as heat qhc5. The heat qhc5 becomes qht3 by heat transfer in the rear case 15 and is released from the back face 31.

Next, the action of the handset 25 will be described.

The handset 25 according to the first embodiment includes the housing 11, the substrate 33 located within the housing, the heat source (for example, the CPU 35) disposed on the substrate 33, the first member 37 provided between the housing 11 and the substrate 33 and between the housing 11 and the heat source, and a plurality of second members 47 that support the first member 37 with respect to the substrate 33. The first member 37 has the gap 45 with the heat source and with the housing 11. Among the plurality of second members 47, the area of the second member 47 far from the heat source in contact with the substrate 33 and the first member 37 is larger than the area of the second member 47 close to the heat source in contact with the substrate 33 and the first member 37.

In the handset 25 according to the first embodiment, when the heat source mounted on the substrate 33 is driven, Joule heat is generated from the heat source. Most of the generated Joule heat is conducted and diffused by heat conduction in the substrate 33. The heat diffused to the substrate 33 is conducted by heat conduction to the plurality of second members 47 in contact with the substrate 33. In the second member 47 in contact with the substrate 33, an opposite side of the substrate 33 is in contact with the first member 37.

Therefore, the heat from the heat source is first diffused to the substrate 33 by heat conduction, then passes through the second member 47, and is conducted to the first member 37. Here, with respect to areas of the plurality of second members 47 in contact with the substrate 33 and the first member 37, the area of the second member 47 far from the heat source is larger than the area of the second member 47 close to the heat source.

Incidentally, heat and electricity are similar. Considering a potential for heat to flow, a temperature difference $\Delta t$ corresponds to a voltage difference $\Delta V$, and a heat flow corresponds to a current.

$$q=\Delta t/(1/\lambda S),\ i=\Delta V/R \qquad \text{(Mathematical formula 1)}$$

From (Mathematical formula 1), $1/\lambda S$ corresponds to electric resistance R by heat. This is referred to as heat resistance. Wherein, 1 is thickness, S is area, and $\lambda$ is heat conductivity (W/mK).

(Effects of Claim 1)

With respect to the areas (S) of the second member 47 in contact with the substrate 33 and the first member 37, since the second member 47 far from to the heat source is larger than the second member 47 close to the heat source, the thermal resistance $(1/\lambda S)$ conducted to the first member 37 through the second member 47 decreases at a position far from the heat source. Therefore, most of the heat from the heat source is conducted to the first member 37 after detouring a long distance of the substrate 33. Heat conduction to a far position of the substrate 33 at this time is also promoted by a circuit pattern such as copper foil provided on the substrate 33. It is possible to transfer heat without using an expensive member such as a heat pipe. This makes it possible to spread the heat of the heat source to every corner of the substrate 33 averagely.

Even at a position close to the heat source, the heat from the heat source is conducted to the first member 37 through the second member 47, but since the area (S) in contact of the second member 47 at a position close to the heat source is small, only a little heat is conducted as compared with the second member 47 at a position far from the heat source.

The first member 37 provides the gap 45 with the heat source and with the housing 11. The heat from the heat source is also conducted to the first member 37 by heat convection or heat radiation through the gap 45. The heat conducted to the first member 37 by the heat convection or heat radiation has an extremely small value as compared with the heat conducted by heat conduction in the substrate 33 with which the heat source is in contact. Therefore, in the handset 25, thermal resistance between the heat source and the first member 37 significantly increases by an air layer in the gap 45, and the heat from the heat source is easily diffused into the entire substrate 33.

In addition, the heat conducted to the first member 37 through the plurality of second members 47 is conducted from the first member 37 to the housing 11 through the gap 45. Therefore, since the heat widely diffused to the first member 37 by the second member 47 is further slowly conducted to the housing 11 by heat convection or heat radiation through the gap 45, the heat becomes even easier to spread evenly over the entire housing.

In this way, in the handset 25, the heat from the heat source can be conducted to the housing 11 in a wide range, and a local high temperature portion due to the heat from the heat source conducted to the housing 11 over a short distance does not occur. As a result, it is possible to lower the temperature of the housing 11 as a whole while preventing the front face of the housing from being locally hot.

In the handset 25, the second member 47 far from the heat source is a sheet 49 having heat conductivity, and the second member 47 close to the heat source is the spring 51 or the pin.

In the handset 25, the second member 47 far from the heat source is the sheet 49 having heat conductivity. One face of the sheet 49 is pasted to the substrate 33, and the other face of the sheet 49 is pasted to the first member 37. Accordingly, the sheet 49 can support the first member 37 with respect to the substrate 33.

As the first member 37, for example, a heat conductive resin is used. The heat conductive resin has a high heat conductivity and is formed in a plate shape having substantially the same size as the substrate 33 and is disposed parallel to the substrate 33.

As the sheet 49, a heat conductive sheet having a high heat conductivity is used. The heat of the substrate 33 can be conducted to the first member 37 while the sheet 49 is in contact with the substrate 33 and the first member 37 in a larger area than that of the other second members 47. The sheets 49 may be one piece or a plurality of pieces.

The second member 47 close to the heat source is the spring 51 or the pin. A base end of the spring 51 or the pin is fixed to the substrate 33, and an upper end of the spring 51 or the pin is fixed to or abutted on the first member 37. Accordingly, the spring 51 or the pin supports the first member 37 with respect to the substrate 33. As the spring 51 or the pin, copper or aluminum having a high heat conductivity can be used. The heat of the substrate 33 is conducted to the first member 37 while the spring 51 or the pin is in contact with the substrate 33 and the first member 37 in a smaller area than the area of the sheet 49. Since the spring 51 or the pin is dispersed, the heat from the substrate 33 cannot be conducted intensively to the first member 37.

In the handset 25, the third member 53 having a higher heat conductivity than that of the housing 11 is provided on a face of the housing 11 on the first member side.

In the handset 25, the third member 53 having a higher heat conductivity than that of the housing 11 is provided on a face of the housing 11 on the first member side. As the third member 53, for example, a graphite sheet having a high heat conductivity is used. The third member 53 is pasted to the back face 31 of the housing 11 so as to substantially cover the entire area of the back face 31. The third member 53 pasted to the back face 31 of the housing 11 is disposed parallel to the first member 37 through the gap 45. Accordingly, heat from the first member 37 is conducted to the third member 53 by heat convection or heat radiation through the gap 45. The heat is slowly conducted from the first member 37 to the third member 53 through the air layer in the gap 45. Due to the high heat conductivity of the third member 53, the heat conducted to the third member 53 becomes even more easily to spread evenly over the entire housing.

The second member 47 far from the heat source among the plurality of second members 47 is provided in the vicinity of an outer periphery of the substrate 33.

In the handset 25, an edge of the first member 37 may be more reliably fixed to the substrate 33 by disposing the spring 51 or the pin outside the sheet 49 taking heat conduction as a main function. In this case, control of detailed heat transfer to the periphery of the substrate 33 through the spring 51 or the pin can be made possible. That is, in the handset 25, the heat from the heat source may be diffused to the first member 37 in a wider range while ensuring fixation of the first member 37.

In the first embodiment, although a case where the heat release device is the handset 25 has been described as an example, the heat release device may be, for example, a general information processing device such as a smartphone or a tablet terminal as long as it is a device including an electronic component serving as a heat source, the substrate 33, and the housing 11.

Although various embodiments have been described above with reference to the drawings, it is needless to say that the present disclosure is not limited to such examples. It will be apparent to those skilled in the art that various changes, modifications, replacements, additions, deletions, equalizations can be conceived within the scope described in the claims, and it will be understood that those certainly belong to the technical scope of the present disclosure. Each constituent element in the various embodiments described above may be combined optionally in the range without deviating from the spirit of the invention.

For example, the first member 37 and the sheet 49 may be integrally formed. In addition, although the third member 53 may not be provided when the rear case 15 has sufficient heat conductivity, the third member 53 is preferably provided as in the present embodiment since a material of the rear case 15 is limited.

The present disclosure is useful as a heat release device which can lower a temperature of a housing as a whole while preventing a front face of the housing from being locally hot.

What is claimed is:

1. A heat release device comprising:
   a housing;
   a substrate located within the housing;
   a heat source disposed on the substrate;
   a first member provided between the housing and the substrate and between the housing and the heat source; and
   a plurality of second members that support the first member from the substrate, wherein:
   the first member is disposed so as to have a gap with the heat source and so as to have a gap with the housing; and
   among the plurality of second members, a second member far from the heat source is larger in area in contact with the substrate and the first member than a second member close to the heat source.

2. The heat release device according claim 1, wherein:
   the second member far from the heat source is a sheet having heat conductivity; and
   the second member close to the heat source is a spring or a pin.

3. The heat release device according claim 1, wherein:
   a third member having a heat conductivity higher than that of the housing is provided on a face of the housing facing to the first member.

4. The heat release device according claim 1, wherein:
   the second member far from the heat source among the plurality of second members is provided near an outer periphery of the substrate.

* * * * *